United States Patent
Hou et al.

(10) Patent No.: US 8,507,957 B2
(45) Date of Patent: Aug. 13, 2013

(54) INTEGRATED CIRCUIT LAYOUTS WITH POWER RAILS UNDER BOTTOM METAL LAYER

(75) Inventors: Yung-Chin Hou, Taipei (TW); Shyue-Shyh Lin, Zhubei (TW); Li-Chun Tien, Tainan (TW); Shu-Min Chen, Yongkang (TW); Pin-Dai Sue, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 41 days.

(21) Appl. No.: 13/098,925

(22) Filed: May 2, 2011

(65) Prior Publication Data

US 2012/0280287 A1    Nov. 8, 2012

(51) Int. Cl.
*H01L 23/48* (2006.01)
*H01L 21/768* (2006.01)
*H01L 29/41* (2006.01)

(52) U.S. Cl.
USPC .......... 257/288; 257/618; 257/E29.226

(58) Field of Classification Search
None
See application file for complete search history.

(56) References Cited

U.S. PATENT DOCUMENTS

| | | | | |
|---|---|---|---|---|
| 5,929,469 A * | 7/1999 | Mimoto et al. | | 257/208 |
| 6,818,929 B2 * | 11/2004 | Tsutsumi et al. | | 257/204 |
| 7,129,562 B1 * | 10/2006 | Gheewala et al. | | 257/574 |
| 8,174,052 B2 * | 5/2012 | Kim et al. | | 257/207 |
| 8,247,846 B2 * | 8/2012 | Becker | | 257/211 |
| 8,258,057 B2 * | 9/2012 | Kuhn et al. | | 438/637 |
| 2003/0023937 A1 * | 1/2003 | McManus et al. | | 716/1 |
| 2007/0096154 A1 * | 5/2007 | Shimbo et al. | | 257/207 |
| 2007/0300202 A1 * | 12/2007 | Uchida | | 716/17 |
| 2008/0111158 A1 * | 5/2008 | Sherlekar et al. | | 257/207 |
| 2008/0169487 A1 * | 7/2008 | Shimbo et al. | | 257/207 |
| 2009/0315079 A1 * | 12/2009 | Tien et al. | | 257/207 |
| 2010/0006912 A1 * | 1/2010 | Larsen et al. | | 257/296 |
| 2010/0097875 A1 * | 4/2010 | Vinke et al. | | 365/226 |
| 2010/0181600 A1 * | 7/2010 | Law et al. | | 257/204 |
| 2010/0269081 A1 * | 10/2010 | Hou et al. | | 716/9 |

* cited by examiner

*Primary Examiner* — Thomas L Dickey
*Assistant Examiner* — Joseph Schoenholtz
(74) *Attorney, Agent, or Firm* — Slater & Matsil, L.L.P.

(57) ABSTRACT

A circuit includes a semiconductor substrate; a bottom metal layer over the semiconductor substrate, wherein no additional metal layer is between the semiconductor substrate and the bottom metal layer; and a cell including a plug-level power rail under the bottom metal layer.

18 Claims, 7 Drawing Sheets

INTEGRATED CIRCUIT LAYOUTS WITH POWER RAILS UNDER BOTTOM METAL LAYER

BACKGROUND

In the formation of integrated circuits, standard cells are often used as base elements for building integrated circuits. The standard cells are placed and routed to form functional circuits. In typical layouts of standard cells, power rails are laid out on the boundaries of the cells. When a plurality of standard cells are placed as rows, the power rails of the standard cells in the same row are connected with each other to form a long power rail that may expand through, for example, thousands or more standard cells. The power rails in neighboring rows are merged to form a power rail having a width twice as wide as the power rail in a stand-alone standard cell. For example, the VDD power rail of a row is merged with another VDD power rail of a neighboring row, and the VSS power rail of a row is merged with another VSS power rail of a neighboring row. Accordingly, with a circuit including a plurality of rows, the VDD power rails and VSS power rails are placed in an alternating pattern.

To provide power to the standard cells, additional metal features are needed to connect the power rails to the features in the standard cells. For example, to connect a VDD power rail to a source of a PMOS transistor in a standard cell (such as an inverter cell), a metal feature (known as a jog) is formed in the same metal layer as the VDD power rail. The jog has one end connected to the VDD power rail. The jog extends to directly over the source of the PMOS transistors, so that a contact plug may be formed to connect the jog to the source of the PMOS transistor.

When the standard cells are placed as rows, there are many jogs extending from a power rail to directly over the respective standard cells. Since power rails are quite wide compared to jogs, there are process issues to be solved for forming the jogs. In addition, existing power routing schemes require significant amounts of routing resource (such as chip area) that otherwise could be used for routing signal lines.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel layout scheme of power rails and the resulting layouts of standard cells are provided in accordance with an embodiment. The variations of the embodiment are discussed. Throughout the various views and illustrative embodiments, like reference numbers are used to designate like elements.

Figure 1:
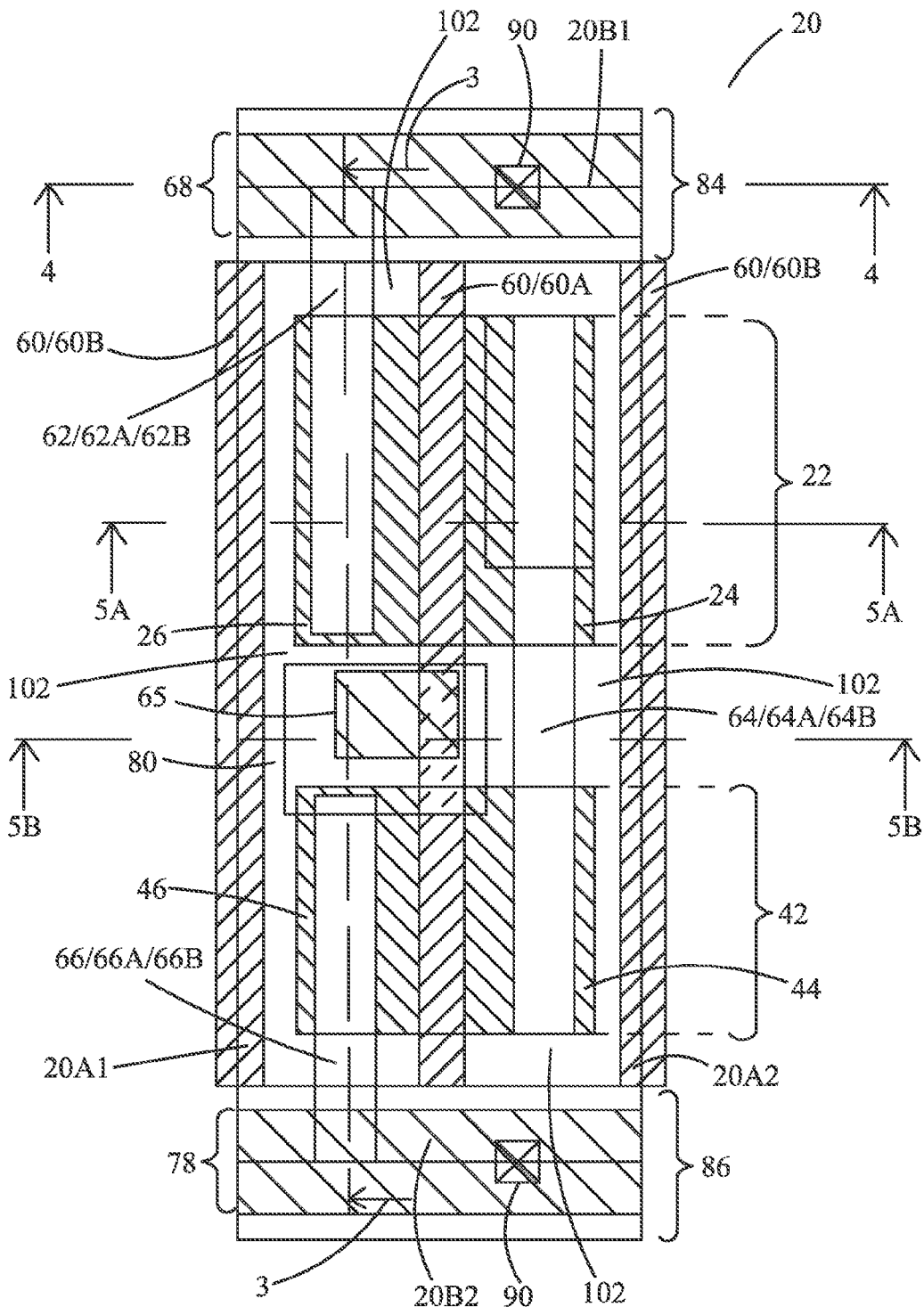
FIG. 1 illustrates a layout of a standard cell in accordance with an embodiment, wherein plug-level power rails are used for providing power to the standard cell.

FIG. 1 illustrates a layout of standard cell 20 in accordance with an embodiment. In an embodiment, cell 20 is an inverter including PMOS transistor 22 and NMOS transistor 42. In alternative embodiments, cell 20 may be any other type of standard cell such as an NAND gate, a multiplexer, or the like. Cell 20 has boundaries 20A1 and 20A2 that are parallel to each other, and boundaries 20B1 and 20B2 that are parallel to each other. It is noted that the features outside cell 20 do not belong to cell 20, and belong to the cells that abut cell 20. Furthermore, boundaries 20A1 and 20A2 are parallel to the lengthwise directions of gate electrodes 60, while boundaries 20B1 and 20B2 are perpendicular to the lengthwise directions of gate electrodes 60. Gate electrodes 60 may further include active gate electrode 60A, which comprises portions acting as the gate electrodes (please refer to FIG. 5A) of PMOS transistor 22 and NMOS transistor 42, and dummy gate electrodes 60B. In some embodiments, dummy gate electrodes 60B may be formed on boundaries 20A1 and 20A2, wherein each of dummy gate electrodes 60B includes a half inside cell 20 and a half outside cell 20. In an embodiment, gate electrodes 60 are formed as having a uniform pitch.

PMOS transistor 22 includes active region 23 (not shown in FIG. 1, please refer to FIG. 5A), which further includes drain 24, source 26, and the portion directly under gate electrode 60A. NMOS transistor 42 includes an active region (not shown) including drain 44, source 46 and the portion directly under a portion of gate electrode 60A.

Figure 2:
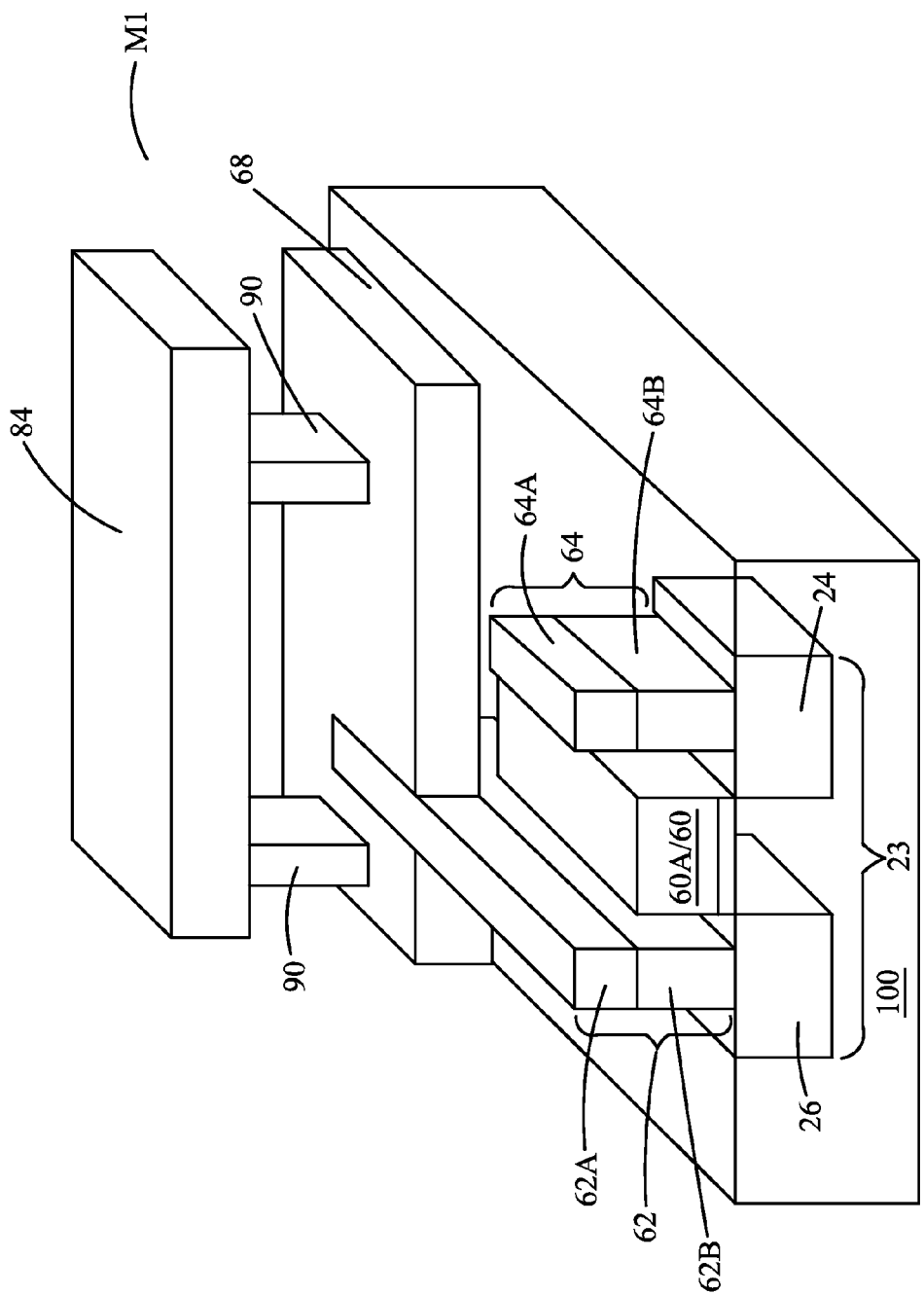
FIG. 2 is a perspective view of a portion of the cell shown in FIG. 1.
Figure 3:
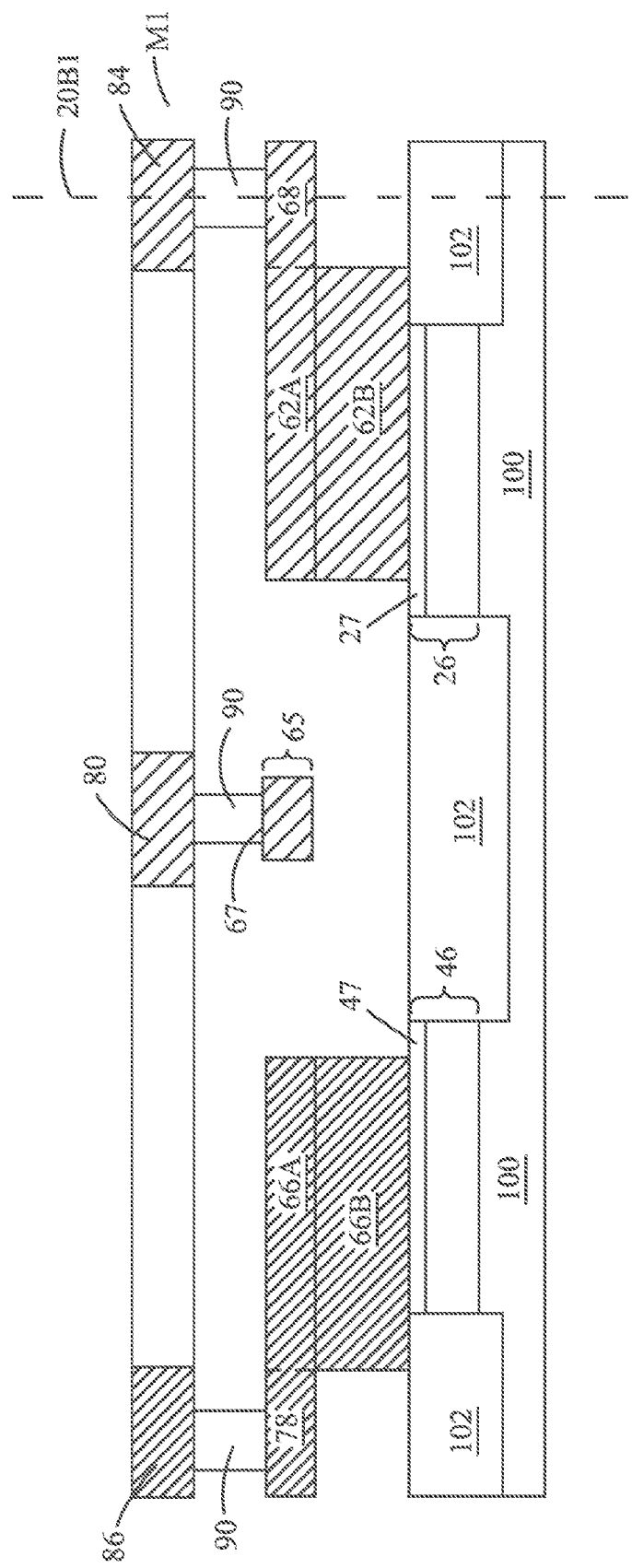
FIGS. 3 through 5B are cross-sectional views obtained from the structure shown in FIG. 1.

Throughout the description, the term "M1" refers to the bottom metal layer that is above gate electrode 60 (please refer to FIG. 2), wherein no additional metal layers are between bottom metal layer M1 and gate electrodes 60. The term "plug-level" is used to refer to the features that are formed at the same level as, and may be formed using the same material and same process steps as, contact plug 65 (please refer to FIG. 5B) that connects gate electrode 60 to metal feature 80 in bottom metal layer M1. As shown in FIGS. 1 through 3, Conductive line 62 is formed over source 26 of PMOS transistor 22, and electrically connects source 26 to plug-level VDD power rail 68 (please also refer to FIG. 2). Conductive line 62 includes upper portion 62A, which is referred to as a plug-level feature, and lower portion 62B under and contacting upper portion 62A. Conductive line 66 is formed over source 46 of NMOS transistor 42, and electrically connects source 46 to plug-level VSS power rail 78. Conductive line 66 may have essentially the same structure as conductive line 62, and may include an upper portion 66A (not shown) at a same level as plug-level feature 62A, and a lower portion 66B (not shown) at a same level as plug-level feature 62B (please refer to FIG. 3). Conductive line 64 is formed over and electrically interconnects drain 24 of PMOS transistor 22 and drain 44 of NMOS transistor 42. As shown in FIG. 2, conductive line 64 includes upper portion 64A, which is a plug-level feature, and lower portion 64B under and contacting upper portion 64A.

Referring to FIG. 1 again, VDD power rail 84 (which is located in bottom metal layer M1, and hence is referred to as M1 VDD power rail 84 hereinafter) is formed at the boundary 20B1 of cell 20, wherein a half of M1 VDD power rail 84 is formed in cell 20, so that when cell 20 abuts another cell (not shown) in a different row of standard cells in an integrated circuit, M1 VDD power rail 84 of the other cell is merged with the VDD power rail 84 in cell 20. Both plug-level VDD power rail 68 and M1 VDD power rail 84 may extend from boundary 20A1 all the way to boundary line 20A2. Plug-level conductive line 62A is electrically connected to plug-level VDD power rail 68. Similarly, VSS power rail 86 (which is located in bottom metal layer M1, and hence is referred to as M1 VSS power rail 86 hereinafter) is formed at boundary 20B2 of cell 20, wherein a half of M1 VSS power rail 86 is formed in cell 20, so that when cell 20 abuts another cell in a different row, the M1 VSS power rail of the other cell is merged with M1 VSS power rail 86 in cell 20. Both plug-level VSS power rail 78 and M1 VSS power rail 86 may extend from boundary 20A1 all the way to boundary 20A2. Accordingly, in cell 20, each of plug-level VDD power rail 68, M1 VDD power rail 84, plug-level VSS power rail 78, and M1 VSS power rail 86 extends to three boundaries of cell 20. Conductive line 66 is connected to plug-level VSS power rail 78. Vias 90 (not shown in FIG. 1, please refer to FIGS. 2 through 4) are formed to connect plug-level VDD power rail 68 to the overlying M1 VDD power rail 84, and to connect plug-level VSS power rail 78 to the overlying M1 VSS power rail 86.

Figure 5A:
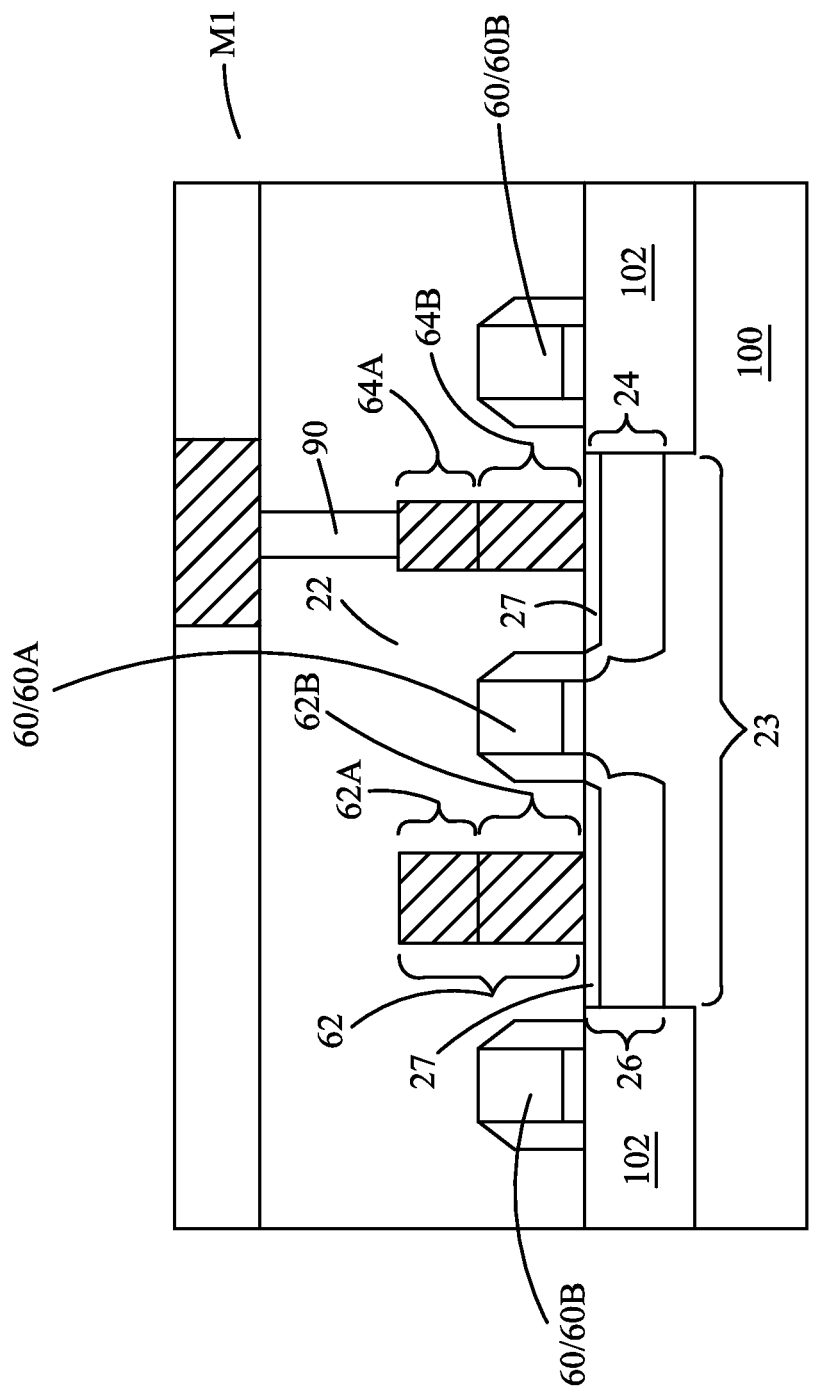
Figure 5B:
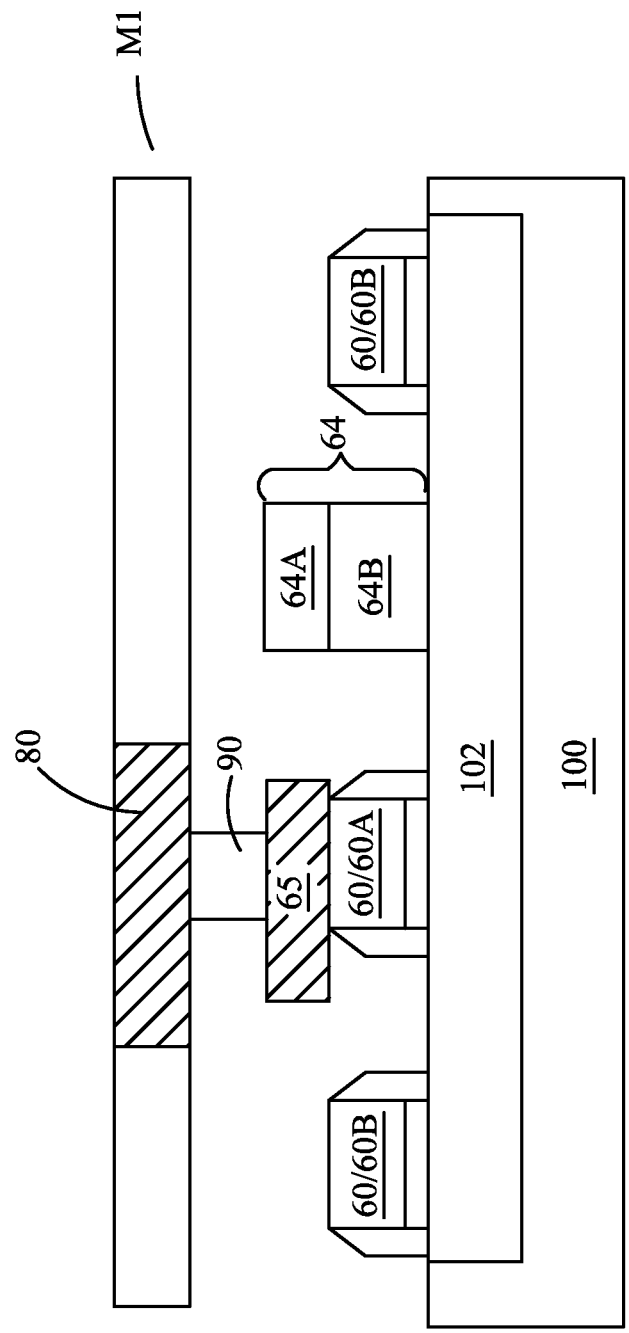

FIG. 2 illustrates a perspective view of a portion of the structure shown in FIG. 1. Drain 24 and source 26 are formed in active region 23, which is in semiconductor substrate 100. Conductive lines 62 and 68 (feature 68 is not shown in FIG. 2) are formed over semiconductor substrate 100 and under bottom metal layer M1, in which M1 VDD power rail is located. Plug-level features 62A, 64A, 65, 66A, 68, and 78 (also refer to FIGS. 1 and 3) are at a same level. As shown in FIGS. 2, 5A, and 5B, each of these plug-level features has a bottom surface level with, or substantially level with, top surfaces of gate electrode lines 60. In an embodiment, the top surfaces of plug-level features 62A, 64A, 65, 66A, 68, and 78 are substantially level with each other. The bottom surfaces of plug-level features 62A, 64A, 65, 66A, 68, and 78 may also be substantially level with each other. Plug-level features 62A, 64A, 65, 66A, 68, and 78 may be formed of a same material, which may comprise metals such as tungsten. In an embodiment, plug-level features 62A, 64A, 65, and 66A are formed simultaneously with plug-level power rails 68 and 78. Accordingly, plug-level features 62A and 64A may form continuous features with the respective connecting plug-level power rails 68 and 78. Alternatively, plug-level features 62A, 64A, 65, and 66A and plug-level power rails 68 and 78 may be formed using separate process steps. Accordingly, there may be noticeable interfaces (such as what is shown in FIG. 2) between plug-level features 62A and 68 (as shown in FIG. 2), and between plug-level features 64A and 78.

FIG. 3 illustrates a cross-sectional view of the structure shown in FIG. 1, wherein the cross-sectional view is obtained from the plane crossing line 3-3 in FIG. 1. As shown in FIG. 3, plug-level conductive line 62A is electrically coupled to source 26 (for example, silicide region 27 of source 26), and extends to directly over STI region 102. The bottom surface of plug-level conductive line 62A may contact metal feature 62B, which further contacts the top surface of silicide region 27. An end of plug-level conductive line 62A contacts a sidewall of plug-level power rail 68. Also shown FIG. 3, plug-level conductive line 66A is electrically coupled to source 46 (for example, silicide region 47 of source 46), and extends to directly over STI region 102. The bottom surface of plug-level conductive line 66A may contact metal feature 66B, which further contacts the top surface of silicide region 47. An end of plug-level conductive line 66A contacts a sidewall of plug-level power rail 78. Vias 90 interconnect plug-level power rail 68 and M1 VDD power rail 84 and plug level power rail 78 and M1 VSS power rail 86. FIG. 3 also illustrates that via 90 is formed between contact plug 65 and metal feature 80, wherein contact plug 65 is connected to gate electrode 60A (not shown in FIG. 3, please refer to FIG. 1). In an embodiment, contact plug 65 and via 90 are formed in different processes, and hence there is a noticeable interface 67. The material of via 90 may be the same as, or different from, the material of contact plug 65, plug-level conductive line 62A, and plug-level power rails 68 and 78.

Figure 4:
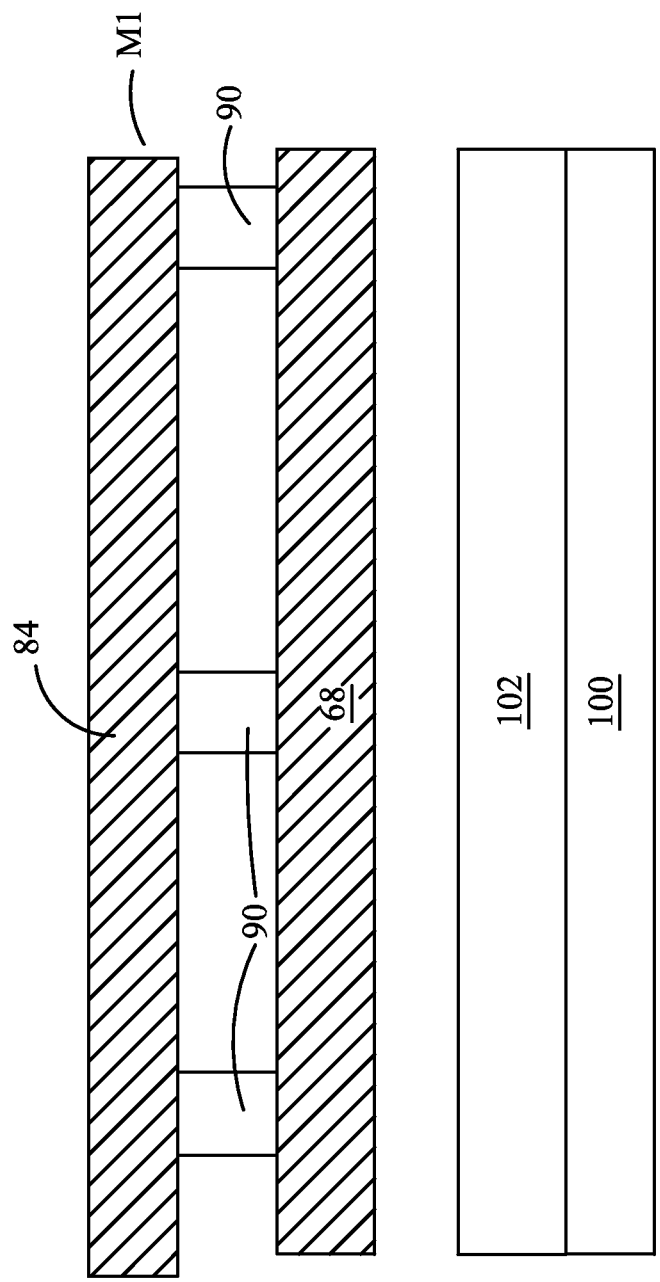

FIG. 4 illustrates a cross-sectional view of the structure shown in FIG. 1, wherein the cross-sectional view is obtained from the plane crossing line 4-4 in FIG. 1. The details of the features shown in FIGS. 4, 5A, and 5B may be found in FIG. 1. As shown in FIG. 4, a plurality of vias 90 may be formed to interconnect plug-level power rail 68 and M1 VDD power rail 84, and to interconnect plug-level power rail 78 and M1 VSS power rail 86 (FIG. 1). FIG. 5A illustrates a cross-sectional view of the structure shown in FIG. 1, wherein the cross-sectional view is obtained from the plane crossing line 5A-5A in FIG. 1. A cross-sectional view of transistor 22 is illustrated. FIG. 5B illustrates a cross-sectional view of the structure shown in FIG. 1, wherein the cross-sectional view is obtained from the plane crossing line 5B-5B in FIG. 1. FIG. 5B illustrates that contact plug 65 is over gate electrode 60A, and the bottom surface of contact plug 65 may contact the top surface of gate electrode 60A. Via 90 further connect contact plug 65 to metal feature 80 in metal layer M1.

Figure 6:
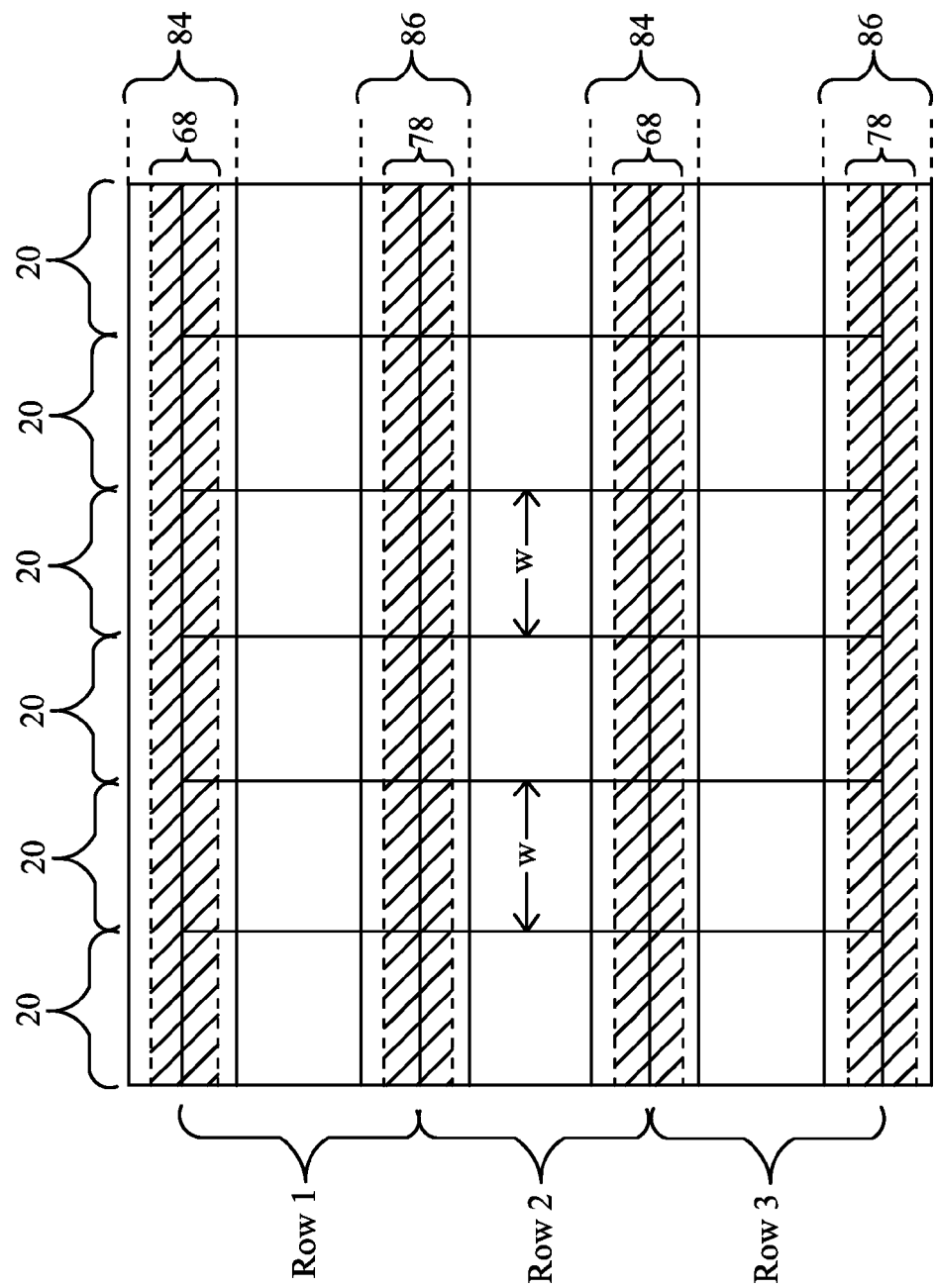
FIG. 6 illustrates a plurality of cells placed as rows, wherein plug-level power rails of the cells are interconnected as long power rails.

FIG. 6 illustrates an exemplary circuit including a plurality of standard cells 20 connected as rows. Standard cells 20 may be inverters, NAND gates, multiplexers, flip-flops, and the like in different combinations. Although cells 20 are in FIG. 6 are shown as have the same width W, the widths of cells 20 may actually be different from each other. For simplicity, the details in standard cells 20 are omitted. Furthermore, plug-levels conductive lines 62A and 64A that are connected to plug-level power rails 68 and 78 are also omitted, although they will be formed. In the exemplary embodiment as shown in FIG. 6, cells 20 in row 1 are abutted to cells 20 in row 2, and cells 20 in row 3 are abutted to cells 20 in row 3. Plug-level VSS power rail 78 in the cells 20 in row 1 and row 2 are merged to form a long VSS power rail that is shared by the cells 20 in rows 1 and 2. Plug-level VDD power rail 68 in cells 20 in row 2 and row 3 are merged to form a long VDD power rail that is shared by cells 20 in rows 2 and 3. Each of plug-level VDD power rail 68 and plug-level VSS power rail 78 are located crossing an interface of two rows of cells.

By using the embodiments, plug-level power rails 68 and 78 have the function of providing power to cells. Since plug-level power rails 68 and 78 are connected to the overlying M1 VDD power rail 84 and VSS power rail 86, respectively, through vias 90, the power supply currents may be shared by plug-level power rails 68 and 78 and M1 power rails 84 and 86. Accordingly, greater currents may be supplied to the cells. In addition, since plug-level power rails 68 and 78 are formed at the same level as contact plugs, some of the chip area in bottom metal layer M1 and metal layer M2 (the metal layer immediate over metal layer M1) for forming power rails may be released and used by signal lines. The routing ability for routing signal lines is thus increased. Furthermore, since M1 power rails 84 and 86 do not have to extend to directly over the active regions (such as sources) of cells, no jogs of M1 power rails are needed, and the process issues for forming the jogs are eliminated.

In accordance with embodiments, a circuit includes a semiconductor substrate; a bottom metal layer over the semiconductor substrate, wherein no additional metal layer is between the semiconductor substrate and the bottom metal layer; and a cell including a plug-level power rail under the bottom metal layer.

In accordance with other embodiments, a cell has a first, a second, a third, and a four boundary, wherein the first and the second boundaries are parallel to each other, and wherein the third and the fourth boundaries are parallel to each other and perpendicular to the first and the second boundaries. A plug-level VDD power rail extends to the first, the second, and the third boundaries. A plug-level VSS power rail extends to the first, the second, and the fourth boundaries. A M1 VDD power rail extends to the first, the second, and the third boundaries, wherein the M1 VDD power rail is in a bottom metal layer and is directly over the plug-level VDD power rail. A M1 VSS power rail extends to the first, the second, and the fourth boundaries, wherein the M1 VSS power rail is in the bottom metal layer and is directly over the plug-level VSS power rail.

In accordance with yet other embodiments, a circuit includes a first row of cells, and a second row of cells abutting the first row of cells. A plug-level power rail extends along an interface of the first and the second rows, wherein the plug-level power rail includes a portion extending into each cell in the first and the second rows of cells. A M1 power rail extends along the interface of the first and the second rows. The M1 power rail has a portion extending into each cell in the first and the second rows of cells. The M1 power rail is in a bottom metal layer immediately over the plug-level power rail. A plurality of vias connects the plug-level power rail to the M1 power rail.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit comprising:
   a semiconductor substrate;
   a bottom metal layer over the semiconductor substrate, wherein no additional metal layer is between the semiconductor substrate and the bottom metal layer;
   a cell comprising a plug-level power rail under the bottom metal layer; and
   an M1 power rail in the cell and in the bottom metal layer, wherein the M1 power rail is electrically connected to the plug-level power rail through a via, and wherein the M1 power rail extends to three boundaries of the cell.

2. The circuit of claim 1, wherein the plug-level power rail extends to three boundaries of the cell.

3. The circuit of claim 2 further comprising an additional plug-level power rail extending to three boundaries of the cell, wherein the additional plug-level power rail and the plug-level power rail are VDD and VSS power rails, respectively.

4. The circuit of claim 1 further comprising a plurality of standard cells forming a row, wherein the plug-level power rail is a part of a power rail extending into the plurality of standard cells.

5. The circuit of claim 4 further comprising a plurality of gate electrodes in the plurality of standard cells and having a uniform pitch, wherein the plurality of gate electrodes is parallel to each other, and wherein lengthwise directions of the plurality of gate electrodes are perpendicular to a lengthwise direction of the plug-level power rail.

6. The circuit of claim 1 further comprising a transistor comprising:
   a gate electrode;
   a contact plug between and interconnecting the gate electrode and a metal feature in the bottom metal layer; and
   a plug-level conductive line connecting a source/drain region of the transistor to the plug-level power rail, wherein a top surface of the plug-level conductive line is substantially level with a top surface of the plug-level power rail.

7. The circuit of claim 6 further comprising a via between and interconnecting the contact plug and a metal feature in the bottom metal layer.

8. A circuit comprising:
   a cell comprising:
      a first, a second, a third, and a four boundary, wherein the first and the second boundaries are parallel to each other, and wherein the third and the fourth boundaries are parallel to each other and perpendicular to the first and the second boundaries;
      a plug-level VDD power rail extending to the first, the second, and the third boundaries;
      a plug-level VSS power rail extending to the first, the second, and the fourth boundaries;
      a M1 VDD power rail extending to the first, the second, and the third boundaries, wherein the M1 VDD power rail is in a bottom metal layer and is directly over and electrically coupled to the plug-level VDD power rail; and
      a M1 VSS power rail extending to the first, the second, and the fourth boundaries, wherein the M1 VSS power rail is in the bottom metal layer and is directly over and electrically coupled to the plug-level VSS power rail.

9. The circuit of claim 8 further comprising:
   a first via between and interconnecting the plug-level VDD power rail and the M1 VDD power rail; and
   a second via between and interconnecting the plug-level VSS power rail and the M1 VSS power rail.

10. The circuit of claim 8 further comprising a transistor in the cell, wherein bottom surfaces of the plug-level VDD power rail and the plug-level VSS power rail are substantially level with a top surface of a gate electrode of the transistor.

11. The circuit of claim 10 further comprising a plug-level conductive line electrically coupling a source/drain region of the transistor to one of the plug-level VDD power rail and the plug-level VSS power rail, wherein a top surface of the plug-level conductive line is substantially level with top surfaces of the plug-level VDD power rail and the plug-level VSS power rail.

12. The circuit of claim 11, wherein the plug-level conductive line comprises an end contacting the one of the plug-level VDD power rail and the plug-level VSS power rail.

13. The circuit of claim 11, wherein the plug-level conductive line and the one of the plug-level VDD power rail and the plug-level VSS power rail form a continuous region.

14. The circuit of claim 8 further comprising gate electrodes in the cell and having lengthwise directions parallel to the first and the second boundaries, wherein the gate electrodes are allocated between, and spaced apart from, the plug-level VDD power rail and the plug-level VSS power rail.

15. A circuit comprising:
a first row of cells;
a second row of cells abutting the first row of cells;
a plug-level power rail extending along an interface of the first and the second rows, wherein the plug-level power rail comprises a portion extending into each cell in the first and the second rows of cells;
a M1 power rail extending along the interface of the first and the second rows, wherein the M1 power rail comprises a portion extending into each cell in the first and the second rows of cells, and wherein the M1 power rail is in a bottom metal layer immediately over the plug-level power rail; and
a plurality of vias connecting the plug-level power rail to the M1 power rail.

16. The circuit of claim 15, wherein the plug-level power rail and the M1 power rail are VDD power rails.

17. The circuit of claim 15, wherein the plug-level power rail and the M1 power rail are VSS power rails.

18. The circuit of claim 15 further comprising:
a semiconductor substrate; and
a transistor in a cell in the first row, the transistor comprising:
a gate electrode over the semiconductor substrate;
a source region extending into the semiconductor substrate; and
a plug-level conductive line electrically coupling the source region to the plug-level power rail, wherein a top surface of the plug-level conductive line is level with a top surface of the plug-level power rail.

* * * * *